United States Patent [19]

Rao

[11] Patent Number: 5,568,431

[45] Date of Patent: *Oct. 22, 1996

[54] MEMORY ARCHITECTURE AND DEVICES, SYSTEMS AND METHODS UTILIZING THE SAME

[75] Inventor: G. R. Mohan Rao, Dallas, Tex.

[73] Assignee: Cirrus Logic, Inc., Fremont, Calif.

[ * ] Notice: The term of this patent shall not extend beyond the expiration date of Pat. No. 5,473,566.

[21] Appl. No.: 531,755

[22] Filed: Sep. 21, 1995

Related U.S. Application Data

[63] Continuation of Ser. No. 304,508, Sep. 12, 1994, Pat. No. 5,473,566.

[51] Int. Cl.$^6$ ........................................................ G11C 7/00
[52] U.S. Cl. .................... 365/189.12; 365/239; 365/240; 365/230.03; 365/230.05
[58] Field of Search ......................... 365/189.12, 230.05, 365/230.09, 230.03, 231, 239, 240

[56] References Cited

U.S. PATENT DOCUMENTS 4,987,559  1/1991  Miyauchi et al. ................. 365/230.05
5,161,221  1/1992  Van Nostrand ........................ 365/240
5,200,925  3/1993  Morooka ................................ 365/239
5,270,973  12/1993  Guiliemond et al. .................... 365/200
5,377,154  12/1994  Taku sugi ........................... 365/189.04
5,463,591  10/1995  Aimoto et al. ..................... 365/189.12
5,473,566  12/1995  Rao et al. .......................... 365/189.12

Primary Examiner—David C. Nelms
Assistant Examiner—Vu A. Le
Attorney, Agent, or Firm—Winstead Sechrest & Minick, P.C.

[57] ABSTRACT

A memory 200 is provided including a plurality of arrays 202 of memory cells 203. A plurality of registers 211 are also provided, each register 211 for exchanging parallel bits of data with a corresponding one of the arrays 202. Data transfer circuitry 210, 213 is included for transferring parallel bits of data from any selected one of the arrays 202 through the corresponding register 211 to any other selected one of the arrays 202 through the corresponding register 211.

20 Claims, 2 Drawing Sheets

MEMORY ARCHITECTURE AND DEVICES, SYSTEMS AND METHODS UTILIZING THE SAME

This is a continuation of application Ser. No. 08/304,508 filed Sep. 12, 1994, U.S. Pat. No. 5,473,566.

TECHNICAL FIELD OF THE INVENTION

The present invention relates in general to electronic memories and in particular to an improved memory architecture and devices, systems and methods utilizing the same.

BACKGROUND OF THE INVENTION

Bit block transfer (BitBLT) is an important performance enhancement technique used in digital data processing, graphics and video applications, and in particular in "windowing" applications. In general, in a bit block transfer ("block move"), an entire block of data (also known as bitmaps) is transferred from a first (source) block of storage locations in display memory to a second (destination) block of storage locations in display memory. In graphics systems BitBLTs can improve operational speed since the data transfers typically remain local to graphics controller thereby reducing the tasks required to be performed by the CPU. Similarly, entire blocks of data may be copied from a set of source locations in memory to a set of destination locations in memory by a block copy.

There are a number of known techniques for implementing bit block transfers (copies). For example, a block of source locations in memory may be identified by the addresses corresponding to a pair of "corners" of the block (or two pairs of corners if the block is a rectangle); the address of one "corner" defining a starting row and a starting column address, and the address of a second corner defining an ending row and an ending column address. Once the starting and ending addresses for the block are specified, the remaining source addresses can be derived therefrom using counters and associated circuitry. The destination block can similarly be identified. It should be noted that there are other known techniques of identifying a block of storage locations, such as defining a single starting address ("corner") and the size ("dimensions") of the block being moved or copied. To implement the actual transfer, the BitBLT circuitry and software sequence through the source addresses and each word in the identified source block is moved (or copied) from its source address and sent to a corresponding destination address. In essence, typical bit block transfer techniques read data from the source block of memory locations a word or byte at a time and then write that data into the destination block of memory a word or byte at a time. It should also be noted that some BitBLT implementations can perform more sophisticated operations which cross "byte" boundaries in a word.

In windowing display systems, bit block transfers are often used when blocks ("windows") of information are transferred from one position on the display screen to another position on the display screen, such as when a data window is dragged across the screen by a mouse, or a "window" on a screen is "processed" for some specific application. In this case, the bit block transfer circuitry and software move the corresponding pixel data in the frame buffer (display memory) from the address space corresponding to the original position on the display screen to the address space corresponding to the new position on the display screen. The bit block transfer allows pre-existing pixel data to be used to generate data on the display screen thereby eliminating the need for the system CPU to regenerate the same pixel data to define the same image on the screen. Similarly, bit block transfers can be used when blocks of information are being copied on the display screen. In this case, the corresponding pixel data is replicated by the bit block transfer circuitry and software and written into one or more additional address spaces of the frame buffer corresponding to the new areas of the display screen to which the original displayed data is being copied.

The speed of presently available bit block transferring systems is limited by the fact that such systems move or copy data from one address space to another address space in memory on a byte or word basis. Thus, the need has arisen for improved circuits, systems and methods for implementing bit block transfers. In particular, such methods, systems and circuits should be applicable to the movement and/or copying of pixel data within the frame buffer of a display system.

SUMMARY OF THE INVENTION

The principles of the present invention are applicable to the construction of electronic memory devices and systems, particularly those memory devices and systems constructed as a single integrated circuit. In general, memory devices and systems embodying the principles of the present invention include a plurality of self-contained memory units. Each memory unit is coupled to one parallel port of a corresponding shift register. A second parallel port of each shift register is coupled to interconnection circuitry, such as a bus. Under the control of associated control circuitry, data may be exchanged between a given memory unit and one or more other such memory units via the corresponding shift registers and the interconnection circuitry. Each shift register may also include a serial port such that each memory unit may exchange data, through the corresponding shift register, to associated input/output circuitry in a serial format.

According to one embodiment of the present invention, a memory is provided which includes a plurality of self-contained memory units for storing data. A plurality of shift registers are provided, each of which includes a first parallel data port coupled to a data port of a corresponding one of the self-contained memory units. Interconnection circuitry is provided coupled to a second parallel data port of each of the shift registers. Control circuitry controls the exchange of data between a selected one of the memory units and the interconnection circuitry via the shift register coupled to the selected memory unit.

According to another embodiment of the present invention, a memory system is provided which includes a plurality of memory subsystems. Each subsystem includes an array of rows and columns of memory cells, row decoder circuitry for selecting a given row of cells in response to a row address, and sense amplifier circuitry for reading and writing data to and from a cell of a selected row and a selected column. The system also includes a plurality of shift registers each for controlling the exchange of data with a respective subsystem.

Another embodiment of the present invention is a memory device which includes a plurality of self-contained memory units for storing data. Each memory unit includes an array of dynamic random access memory cells arranged in rows and columns, circuitry for addressing selected ones of the cells, and sensing circuitry for reading and writing data into the selected cells. The device also includes a plurality of shift registers, each shift register including a first parallel data port coupled to a data port of a corresponding one of the self-contained memory units and a serial port coupled to device input/output circuitry. Interconnection circuitry is coupled to a second parallel data port of each of the shift registers. The system is controlled by control circuitry operable to control the exchange of data between selected cells of a selected one of the memory units and the interconnection circuitry via the parallel ports of the corresponding shift register and between the selected cells and the device input/output circuitry via the serial port of the corresponding shift register.

The principles of the present invention are also embodied in the methods for using the memory devices and systems according to the principles of the present invention. A first method provides for the performing of a data transfer in a memory including a plurality of self-contained memory units, each unit having an array of memory cells arranged in rows and columns and associated addressing circuitry, and a plurality of shift registers each coupling a respective memory unit with interconnection circuitry. According to the method, a plurality of bits are read from a selected row of cells in a first one of the memory units. The plurality of bits from the first memory unit are passed through the corresponding shift register coupled to that unit to the interconnection circuitry. The plurality of bits are then passed through the shift register coupled to a second one of the memory units and written into at least some cells of a given row of the second memory unit.

The principles of the present invention also provide for a method of writing data into a single integrated circuit memory device including a plurality of self-contained memory units, each unit including an array of memory cells arranged in rows and columns and associated addressing circuitry, and a plurality of shift registers each having a serial port and a parallel port coupled to a respective one of the memory units. According to the method, a serial data stream is presented to the serial port of the shift register coupled to a first selected one of the memory units. A first plurality of bits of the data stream are loaded into the shift register coupled to the first memory unit. The first plurality of bits are then written from the shift register coupled to the first memory unit into at least some cells of a selected row of the array of the first memory unit. The data stream is also presented to the serial port of the shift register coupled to a second one of the memory units. A second plurality of bits of the data stream are loaded into the shift register coupled to the second memory unit and then written into at least some cells of a selected row in the array of the second memory unit.

The principles of the present invention additionally provide for a method of reading data into a single integrated circuit memory device including a plurality of self-contained memory units, each including an array of memory cells arranged in rows and columns and associated addressing circuitry, and a plurality of shift registers each having a serial port and a parallel port coupled to a respective one of the memory units. According to the method, a plurality of bits are read from at least some cells of a selected row in the array of a first one of the memory units. The plurality of bits are then loaded into the shift register coupled to the first memory unit through its parallel port and then shifted out of the serial port. A second plurality of bits are read from at least some cells of a selected row in the array of a second one of the memory units. The second plurality of bits are loaded into the shift register coupled to the second memory unit through its parallel port and then shifted out through its serial port.

Memory circuits, systems, and methods embodying the principles of the present invention allow for the flexible storage and retrieval of data in a number of different data processing applications. Among other things, the principles of the present invention allow for the efficient exchange of entire rows of data within memory during a bit block transfer. Further, the individual self-contained memory units of the present invention allow for interleaved data accessing, in either a random or a serial format. Additionally, the self-contained memory units can each be used to independently store and retrieve different types of data. For example, one or more memory units may be dedicated to servicing graphics data being processed by a corresponding graphics processor while one or more other memory units may be used to service a video processor processing video data. Also, individual memory units may be used to individually store and retrieve the data necessary to generate windows on the display screen of a "windowing" system.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
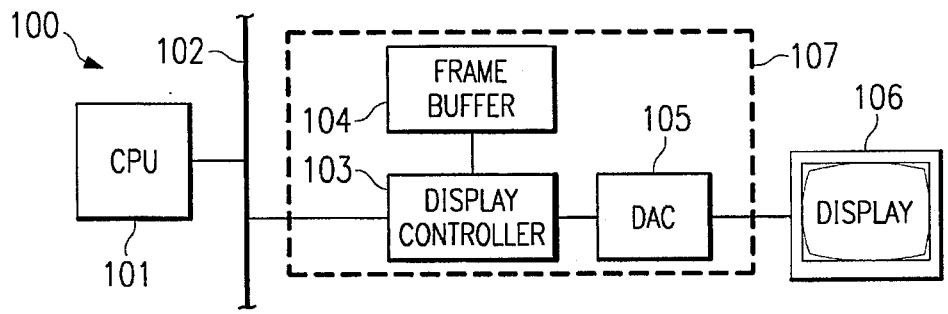
FIG. 1 is a functional block diagram of a graphics/video processing system.
Figure 2:
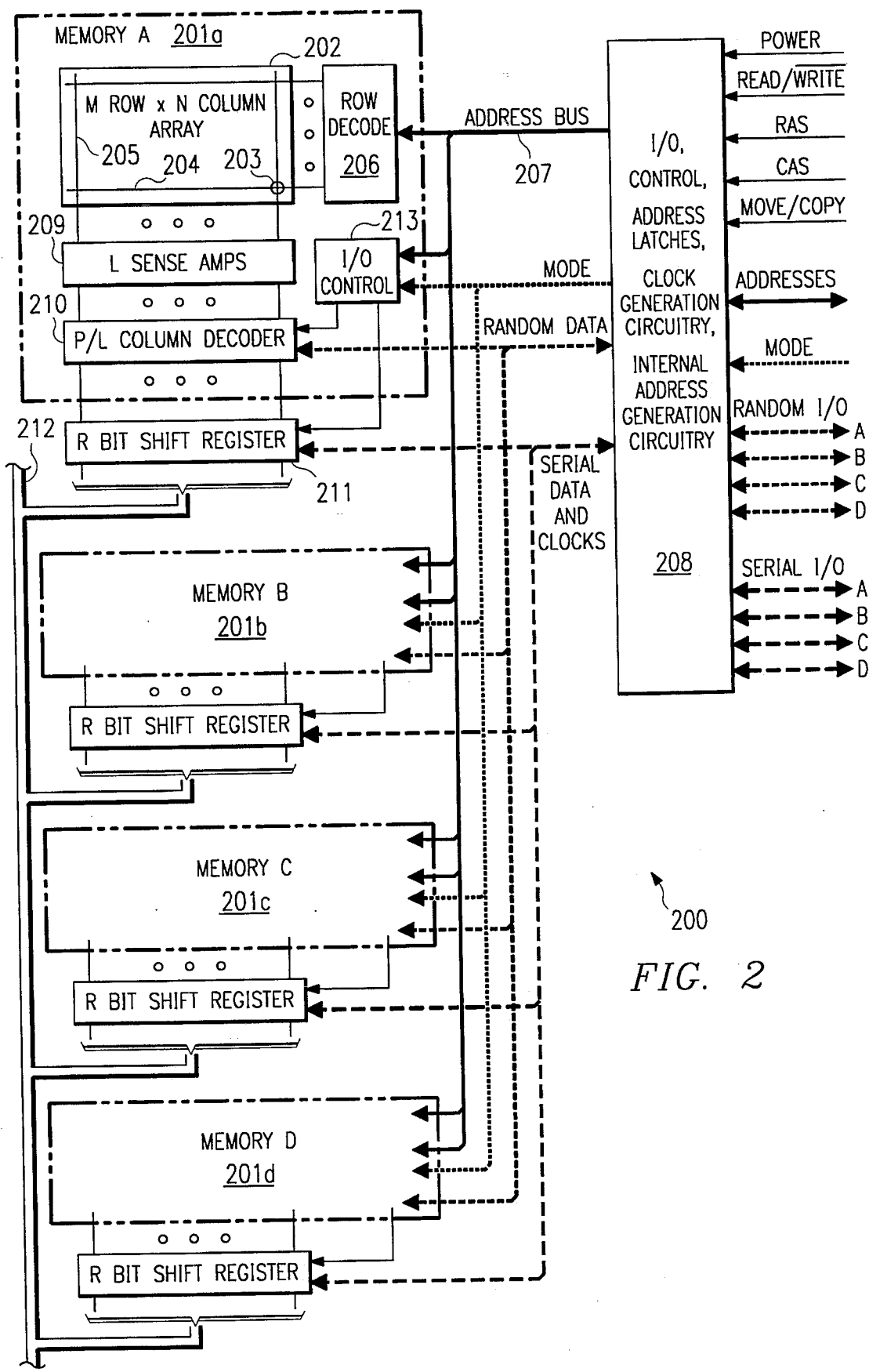
FIG. 2 is a functional block diagram of a memory according to the principles of the present invention, such memory suitable in one application to implementation of the frame buffer of FIG. 1.

The principles of the present invention and their advantages are best understood by referring to the illustrated embodiment depicted in FIGS. 1–3 of the drawings, in which like numbers designate like parts. Further, while the principles of the present invention will be illustrated within the context of a graphics/video processing system, block transfer circuits, systems and methods according to these principles may be employed in any one of a number of processing applications.

FIG. 1 is a high level functional block diagram of the portion of a processing system 100 controlling the display of graphics and/or video data. System 100 includes a central processing unit 101, a system bus 102, a display controller 103, a frame buffer 104, a digital-to-analog converter (DAC) 105 and a display device 106. Display controller 103 may be an integrated video and graphics controller or complemented by separate graphics and video controllers. Similarly, frame buffer 104 may be a shared (unified) video/graphics frame buffer or implemented by separate video and graphics frame buffers. In the preferred embodiment, frame buffer 104, display controller 103 and DAC 105 are fabricated as a single integrated circuit 107.

CPU 101 controls the overall operation of system 100, determines the content of any graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format various circuitry, and/or x- and y-zooming circuitry, to name a few options.

Display 106 may be for example a CRT unit, liquid crystal display, electroluminescent display (ELD), plasma display (PLD), or other type of display device which displays images on a display screen as a plurality of pixels.

In the illustrated embodiment, system 100 is a VGA system driving a display screen on display 106 of 640 columns by 480 rows of pixels. Also for purposes of illustration, each pixel will be assumed to be defined by 24-bits of RGB (true color) data (i.e., 8-bits each for red, green, and blue). Thus, the absolute maximum size of the physical memory of frame buffer 104 will be 640 columns by 480 rows by 24-bits per pixel or approximately one megabyte. It should be noted that the "visual pixels" on the display screen may or may not exactly map to the storage locations in the physical memory of frame buffer 104, depending on the memory formatting selected. Further, all 24-bits of color data defining each pixel may be physically stored in sequential storage locations in physical memory (in which case, all 24-bits could be stored in a given page of a DRAM or VRAM) or may be stored in three different banks or rows of the physical memory of the frame buffer 104.

FIG. 2 is a functional block diagram of a memory system 200 according to the principles of the present invention. In the exemplary system 100, memory system 200 is used to construct frame buffer 104 although memory system 200 may be used in a wide number of applications requiring the movement and/or copying of blocks of data within memory. System 200 may also be used in applications requiring the storage of different types of data, such as shared frame buffer used to simultaneously store both graphics and video data.

In general, memory system 200 includes a plurality of self-contained memory units 201. In the illustrated embodiment, four such self-contained memory units 201a–201d are provided, although the principles of the present invention may be applied to memory systems containing more or less numbers of memory units 201. Each memory unit 201 includes an array 202 of storage cells 203 arranged in M number of rows and N number of columns. Each row of memory cells 203 is associated with a conductive row line (wordline) conductor 204 and each column of cells is associated with a column line (bitline) conductor 205. In the preferred embodiment, each memory cell 203 comprises a dynamic random access memory (DRAM) cell, although in alternate embodiments, each cell 203 may be constructed of another type of memory device, such as a static random access memory (SRAM) cell.

Each memory unit 201 further includes a row decoder 205 coupled to the wordlines of the associated memory array 202. Each row decoder 206 is operable to select (precharge) a given wordline 204 in the corresponding memory array 202. As will be discussed further below, each row decoder 206 may also include a counter or pointer which can sequentially activate the wordlines 204 of the corresponding array 202 during a block transfer or during a memory refresh cycle. Each row decoder 206 receives row address from corresponding row address bus 207 which is further coupled to the address latches of control circuitry 208. In the preferred embodiment each row decoder 206 responds to a unique address space with the two most significant bits of each address latched into input circuitry 208 selecting the row decoder 206 (and hence the memory unit 201) being activated.

Each memory unit 201 includes L number of sense amps 209 coupled to the bitlines 205 of the corresponding memory array 202 (in the preferred embodiment L=N). Sense amps 209 are conventional differential sense amplifiers which detect either voltage or current swings on the bitlines 205 during read operations and refresh the cells along the selected wordline 204 during read and refresh operations. The sense amplifiers 209 of each memory unit 201 are further coupled to a P/L column decoder 210. In turn, each column decoder 210 is coupled to a first parallel port of an R-bit long shift register 211. A second R-bit wide parallel port of each shift register 211 is coupled to an internal R-bit wide databus 212.

The column decoder 210 and shift register 211 of each memory unit 201 are each controlled by corresponding memory unit input/output control circuitry 213 in response to column addresses received from address bus 207 and mode control signals received from input circuitry 208. In one mode, data can be read or written to a selected cell or cells along a selected wordline 204 through the corresponding column decoder 209 in a conventional random fashion. In a second mode, data can be exchanged between internal bus 212 and a selected number of cells along an activated wordline 204 through a selected shift register 211 and column decoder 210. In the preferred embodiment, an entire row of data is transferred in parallel to and/or from a row in a selected memory array 202 through a selected shift register 211 in the second mode. In a third mode, data in a selected cells in the array 202 of a selected unit 201 may be accessed (read or written) through the serial port of the corresponding shift register 211.

In the preferred embodiment, row and column addresses may be sequentially received from an external source through input circuitry 208 and latched in with respective row address strobe (RAS) and column address strobe (CAS) signals. Input circuitry 208 also provides for the exchange of data with each memory unit 201, either in serial through the corresponding shift register 211 or the through the random port provided by the corresponding column decoder 210. Input circuitry also controls the power, read/write, mode control and the move/copy control signals. According to the principles of the present invention, input circuitry 208 also includes internal address generation circuitry which generates the destination addresses required for a block move or copy as described further below.

According to the principles of the present invention, a block move or copy can be performed by transferring data from a given memory unit 201 via the internal bus 212. In contrast to conventional bit block transfer techniques, where data is moved on a word-by-word or byte-by-byte basis, the principles of the present invention allow for the movement of an entire row of data at a time. For example, assume that each array is arranged as 1,024 rows by 1,024 columns and that a given shift register 211 and bus 212 are each 1,024 bits wide, then 1,024 bits or 128 bytes can be moved at a time. For example, assume a block of data from unit 201a is to be transferred to unit 201d. The block may consist of anywhere from a single row to all the rows of data in block 201a. In this case, starting and stopping addresses identifying the source location for the block being moved/copied are received at the address port to input circuitry 208 and latched in with RAS and CAS. These start and stop addresses may for example be the addresses to two or more "corners" of the block being moved (preferably the addresses for four corners are used if the block is rectangular). These source addresses may for example correspond to the "clicking" of a window of data on the display screen by a mouse. The row decoder 206, sense amplifiers 209, and column decoder 210 of memory unit 201a are used to read data from the row corresponding to the start address. The contents of the locations 203 along the selected row are then loaded in parallel into the shift register 211 of memory unit 201a. This data is now available to be shifted out, for example, to the display 106 in system 100. A destination address is then provided to memory unit 201d. The destination addresses may be received from an external source, such as when a window of data is "dragged" to a new location on the display screen by a mouse, and latched into control circuitry 208. The destination address may also be derived (generated) internally from the source starting address, for example by modifying one or more of the significant bits of the corresponding source address. The contents of the shift register 211 of unit 201a can then be shifted via internal bus 212 to the shift register 211 of memory unit 201d. The column decoder 210, sense amplifiers 209, and row decoder 206 of memory unit 201d then provide for the writing of the transferred row of data into the memory array 202 of unit 201d. The counters in row decoders 206 of units 201a and 201d then increment to select the next source and destination rows respectively and the next row of data is transferred from block 201a to block 201d through the corresponding shift registers 211. The entire process is repeated until the entire desired block of data identified in memory unit 201a has been moved or copied into the array of unit 201d (this may be all the data stored in the entire array of unit 201a or a selected portion thereof).

It should be noted, that in some embodiments of system 200, shift registers 211 may be substantially longer than the number of columns in the corresponding memory cell array 202. A long shift register advantageously allows for the continuous output of data even as a row of data is being downloaded from the cell array 202. These embodiments are particularly useful when serial data from a given memory unit 201 or memory units 201 are being used to refresh a display screen, such as the screen on display unit 106 in system 100. For example, assume for purposes of discussion that the cell array 202 of a given memory unit 201 is a two megabyte array organized as 4096 rows by 4096 columns. Assume also that the shift clock clocking data out of the corresponding shift register 211 has a period of 15 nanoseconds. Thus, serial access of an entire row of 4096 bits from a given shift register 211 requires approximately 60 microseconds (4096 bits by 15 nanoseconds/bit). Thus, if each row access requires 100 µs then approximately 600 rows may be accessed during the time it takes to shift out one entire 4096 bit row of data. The length of the given shift register 211 however may be multiple rows in length and have multiple taps such that data can be continually shifted out while a new row of data is loaded from the memory array 202 behind it. For example, if the length of the given shift register 211 is 2.4 megabits in length and such shift register includes 600 taps, each 4096 bits wide, then 302 kilobyte blocks of data can be stored and shifted at a time. It should be noted that each shift register 201 does not necessarily have to be a single device, but may be one or more shift registers coupled in series and/or a multiple phase shift register.

Figure 3A:
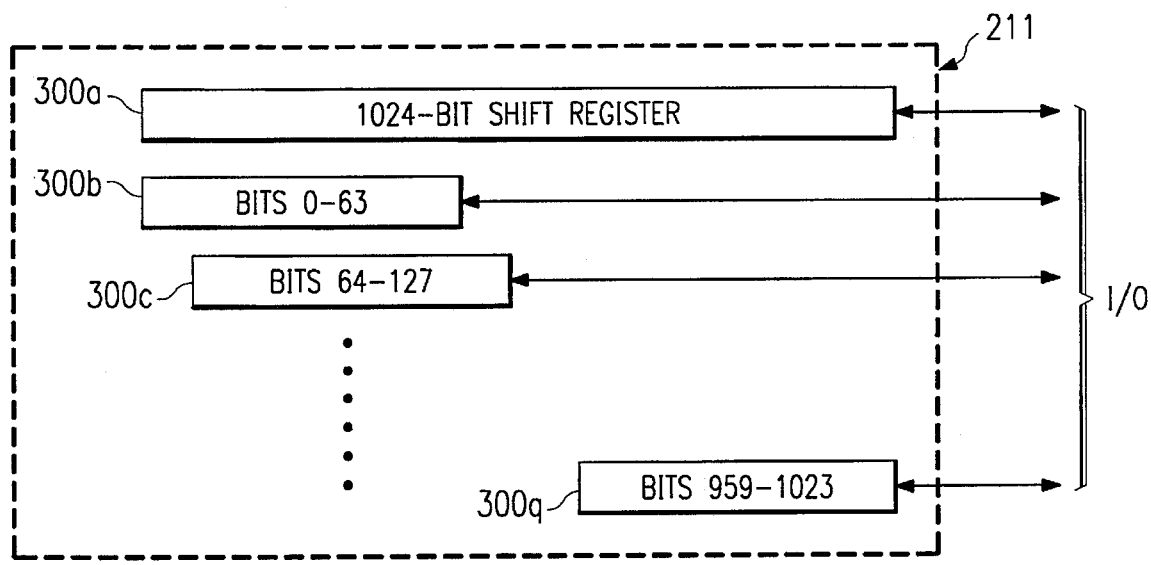
FIG. 3A is a functional block diagram of an alternate implementation of a selected one of the shift registers shown in FIG. 2.
Figure 3B:
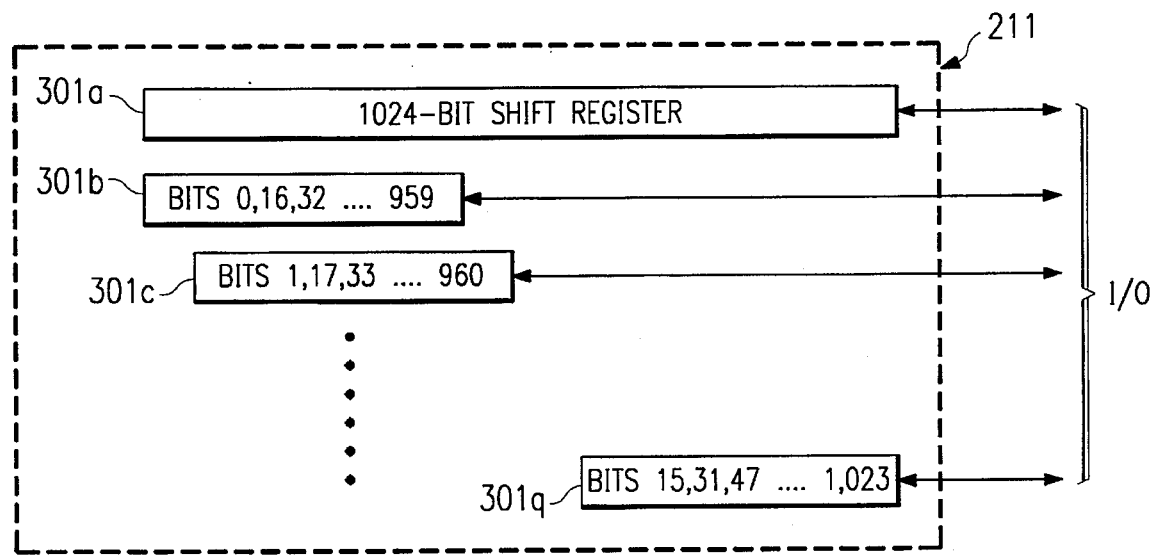
FIG. 3B is a functional block diagram of an alternate implementation of a selected one of the shift registers shown in FIG. 2.

It should also be noted that in some embodiments, each shift register 211 may be implemented by a series of parallel shift registers as shown in FIGS. 3A and 3B. In FIG. 3A, a 1024-bit shift register 211 is shown (supporting 1024-bit rows in the associated memory array 202) along with sixteen 64-bit parallel registers. It should be noted that while in the preferred embodiment both the single 1024-bit shift register and the parallel 64-bit registers are provided, in alternate embodiments, only the 64-bit parallel registers may be used. In the embodiment shown in FIG. 3A, the 64-bit registers each are loaded with a corresponding 64-bits of each 1024-bit row of data read from the corresponding memory array 202 simultaneous with the loading of the 1024-bit shift register. The 64-bit registers 300 can then shift out data in parallel. Each register 300 could then for example service a corresponding conductor of a 64-bit bus.

In FIG. 3B, sixteen 64-bit registers are again provided, however, in this case the starting bit of each register is offset by only a single bit. The multiple taps for each shift register 301b–301q are then equally spaced by 16-bits starting from the initial bit position. In the embodiment of FIG. 3A, individual bits can be more rapidly accessed.

The embodiments of the present invention have substantial advantages over prior art memory devices. Among other things, accesses to memory system 200 may be serviced on an interleaved basis by each of the individual memory units 201. In this instance, one memory unit 201 may be outputting data (advantageously in either a serial or a random fashion) while the other units 201 are in a refresh mode, precharging, or loading their corresponding shift register 211. In this interleaved mode, the addresses on the address bus can be each received from an external source or generated internally by incrementing from a single received address to provide a series of addresses which allow accesses of each memory unit 201 to be interleaved. As discussed above, the address space for the four memory units 201 shown in the illustrated embodiment may be differentiated using the two most significant bits of each address presented on the address bus 207. Thus, for purposes of individually addressing each unit 201 (in either an interleaved or non-interleaved mode) only one or two bits need to be changed.

As discussed above, memory systems, such as system 200, embodying the principles of the present invention also advantageously allow for the movement or copying of blocks of data on a row-by-row basis. Further, depending on the size of each memory array 202, each individual block 201 may be used to drive a display screen when the invention is embodied in a frame buffer system (in the preferred embodiment, each individual array 202 is large enough on its own to provide the necessary frame buffer memory space). Thus, interleaving could be on a "display frame" by "display frame" basis with the memory units 201 alternatively providing the data for the display frames being generated. Additionally, each of the units 201 may be used to provide a separate frame buffer for a corresponding window being generated on the display frame. In a shared (unified) frame buffer one or more units 201 may be used for video processing and one or more units 201 used for graphics processing. Finally, depending on the size of each individual memory array 202, the system frame buffer and other memory needed by display processor 103 can be separately serviced by the individual units 201. For example, one or more of the memory units 201 may function as a frame buffer while the remaining memory units 102 are used for other functions, such as scratchpad memory, storing instructions, etc.

Although the present invention and its advantages have been described in detail, it should be understood that various changes, substitutions and alterations can be made herein without departing from the spirit and scope of the invention as defined by the appended claims.

What is claimed is:

1. A memory device comprising:

a plurality of arrays of memory cells;

a plurality of registers, each of said registers for exchanging parallel bits of data with a corresponding one of said arrays; and data transfer circuitry for transferring parallel bits of data from any selected one of said arrays through the corresponding said register to any other selected one of said arrays through the corresponding said register.

2. The memory device of claim 1 wherein said data transfer circuitry comprises:

addressing circuitry for reading data from selected ones of said cells of a source said array and for writing data to selected ones of said cells of a destination said array;

a bus coupled to said each of said registers for transferring data between said source array and said destination array; and input/output control circuitry for selectively controlling the exchange of data between said registers associated with said source and destination arrays and said bus.

3. The memory device of claim 2 wherein said addressing circuitry comprises first row and column decoders associated with said source array and second row and column decoders associated with said destination array.

4. The memory device of claim 1 wherein said addressing circuitry includes circuitry for generating a sequence of addresses for transferring a block of data from said source array to said destination array.

5. The memory of claim 4 wherein said circuitry for generating generates a sequence of addresses for transferring a block of data in response to a received start address.

6. The memory device of claim 1 wherein each said register comprises a shift register.

7. The memory device of claim 6 wherein each said shift register includes a plurality of taps.

8. The memory device of claim 7 wherein each said array is associated with a plurality of shift registers each offset by a selected number of bit positions.

9. A memory subsystem comprising:

a plurality of arrays of memory cells each arranged in rows and columns;

for each said array, a row decoder and a column decoder for accessing selected ones of said cells of said array;

for each said array, an associated register having a first parallel port coupled to said column decoder;

a common bus coupled to a second parallel port of each said register; and circuitry for coupling data from accessed ones of said cells of a first selected one of said arrays to accessed ones of said cells of a second selected one of said arrays via said parallel ports of said associated registers and said bus.

10. The memory subsystem of claim 9 wherein each said row decoder includes row address increment circuitry for accessing a block of data from a plurality of rows in the corresponding said array.

11. The memory subsystem of claim 9 wherein a selected said register has a bit-length which is greater than the number of columns of the corresponding said array.

12. The memory subsystem of claim 9 and further comprising a plurality of offset shift registers associated with each said array, said plurality of registers loaded substantially simultaneously with loading said register associated with the corresponding said array.

13. The memory subsystem of claim 9 wherein each said register comprises a shift register.

14. The memory subsystem of claim 9 wherein said memory subsystem is fabricated on a single chip.

15. The memory subsystem of claim 9 wherein said memory cells comprise dynamic random access memory cells.

16. The memory subsystem of claim 9 wherein said memory cells comprise static random access memory cells.

17. A method of transferring data in a memory including a plurality of arrays of memory cells, addressing circuitry for accessing selected ones of said cells of a selected array, a common bus, and a plurality of registers each for controlling the exchange of data between a corresponding array and the common bus, the method comprising the steps of:

presenting at least one source address to the addressing circuitry to read data from selected cells of a selected source array;

transferring the data from the source array to the common bus via the corresponding register;

transferring the data to the register corresponding to a destination array; and presenting at least one destination address to the addressing circuitry to write data into selected cells of the destination array.

18. The method of claim 17 and further comprising the steps of:

modifying the source address within the addressing circuitry to read second data from second selected cells of the source array;

modifying the destination address within the addressing circuitry to write second data to second selected cells of the destination array; and transferring the second data from the source array to the destination array via the bus and the registers corresponding to the source and destination array.

19. The method of claim 18 wherein said steps of modifying comprise the substep of incrementing a row address.

20. The method of claim 18 wherein said steps of modifying comprises the substep of modifying a column address.

* * * * *